Sept. 14, 1965 M. J. HELLSTROM 3,206,634

TRANSISTOR DEFLECTION CIRCUIT

Filed April 3, 1959 2 Sheets-Sheet 1

WITNESSES

Leon J. Taga

James F. Young

INVENTOR

Melbourne J. Hellstrom

BY

Benjamin DeWitt

ATTORNEY

Sept. 14, 1965 M. J. HELLSTROM 3,206,634

TRANSISTOR DEFLECTION CIRCUIT

Filed April 3, 1959 2 Sheets-Sheet 2

United States Patent Office 3,206,634
Patented Sept. 14, 1965

3,206,634
TRANSISTOR DEFLECTION CIRCUIT

Melbourne J. Hellstrom, Watchung, N.J., assignor to Westinghouse Electric Corporation, East Pittsburgh, Pa., a corporation of Pennsylvania
Filed Apr. 3, 1959, Ser. No. 803,895
1 Claim. (Cl. 315—27)

This invention relates to electronic oscillators for generating non-sinusoidal pulses, and relates more particularly to deflection waveform generating circuits for cathode ray television receivers.

A feature of this invention is that it provides an electronic oscillator comprising a charging circuit connected through an electronic amplifier to a load inductance, and connected to an electronic switch which is also connected through a regenerative feedback circuit to the load inductance. During one portion of a cycle of operation, the switch, and therefore, the feedback circuit is open, and the charging circuit, through the amplifier, controls the energy to the load inductance. When the waveform developed by the charging circuit reaches a predetermined level, the electronic switch closes and regeneration is initiated in the feedback circuit. During the regenerative portion of the cycle, the charging circuit is restored to its initial condition. At the end of the regenerative portion of the cycle, the feedback controlling switch is opened, and the charging circuit again takes control of the open-switch portion of the cycle. During the regenerative portion of the cycle, energy stored in the load inductance during the charging portion of the cycle, is used to alter the level of the charge in the charging circuit. More specifically, a portion of the energy which was stored in the load inductance during the charging cycle is used, during the regenerative cycle portion, to restore the charging circuit to its initial condition. In certain embodiments of the invention the charging circuit may be simply discharged to zero voltage during the regenerative interval. In other embodiments within the scope of the invention, it is contemplated that the feedback circuit will operate to materially change the level of the charge in the charging circuit without necessarily leaving it at zero charge.

Another feature of this invention is that it provides a sweep circuit for a deflection yoke of a television receiver, in which a sweep capacitor is connected to the input circuit of an electronic amplifier having its output circuit connected to the deflection yoke. The sweep capacitor is charged slowly to provide the sweep. An electronic switch which is open while the sweep capacitor is being charged, and which is closed when the sweep capacitor has been charged to a predetermined level is connected in a regenerative feedback loop including the yoke, to the sweep capacitor. At the end of the sweep, the switch is closed, and energy stored in the yoke during sweep charges the sweep capacitor in the direction opposite to that in which it was previously charged and effects retrace.

Another feature of this invention is that it provides a sweep circuit for a deflection yoke of a television receiver in which positive feedback is used to improve linearity.

An additional feature of one embodiment of this invention is that it provedes an A.C. coupled sweep circuit for a television receiver using two transistors, one of which is a power transistor, and an electronic switch which may be a diode. The output circuit of the power transistor is connected to a deflection yoke. A charging circuit including a sweep capacitor and a sweep resistor, is connected to a low power capacity transistor which drives the power transistor. The use of the driver transistor not only reduces the power dissipated in the sweep resistor, but reduces the charge transferred to and from the sweep capacitor, enabling a smaller sweep capacitor and a driver transistor of lower power rating to be used than would be required if the output transistor was connected to be driven directly by the charging circuit and the driver transistor was used to discharge the large sweep capacitor. The electronic switch which is open while the sweep capacitor is charging, and which closes when the sweep capacitor has been charged to a predetermined level, is connected to the sweep capacitor, and is coupled through a feedback capacitor to the yoke. When the diode switch closes at the end of a sweep, energy stored in the yoke during sweep discharges the relatively small sweep capacitor and effects retrace.

A feature of another embodiment of this invention is that the previously mentioned driver transistor is replaced by a vacuum tube. This embodiment has the advantage that the falling current gain characteristic of the output transistor is compensated for by the rising grid-anode transconductance of the vacum tube, providing linear amplification and more flexibility in obtaining the desired output waveform.

An object of this invention is to reduce the size of sweep capacitors used in complex waveform generating circuits.

Another object of this invention is to provide pulse generating circuits utilizing transistors having reduced voltage and dissipation ratings.

Another object of this invention is to provide a waveform generating network for energizing a load inductance which network includes a charging circuit and in which reactive energy stored in the load inductance is used to alter the charge in the charging circuit.

Another object of this invention is to use energy stored in a deflection yoke of a cathode ray tube during sweeps, to discharge a sweep capacitor to the level that exists at the time the sweeps originate thereby to effect retrace.

Another object of this invention is to use positive feedback in a television receiver sweep circuit, to improve linearity.

This invention will now be described with reference to the annexed drawings, of which:

Figure 1:
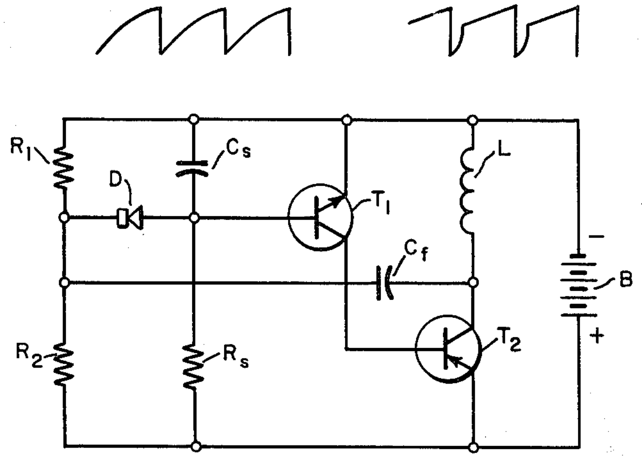
FIG. 1 is a simplified circuit diagram of a pulse generating circuit embodying certain features of this invention.

Referring first to FIG. 1, a sweep capacitor $C_s$ is connected in series with a sweep resistor $R_s$ across battery B. Diode switch D has its cathode connected to the junction of voltage divider resistors $R_1$ and $R_2$ which are connected in series across the battery B. The anode of the diode switch D is connected to the junction of the capacitor $C_s$ and the resistor $R_s$, which junction is also connected to the base of NPN driver transistor $T_1$. The emitter of the transistor $T_1$ is connected to the negative terminal of the battery B, and its collector is connected to the base of PNP output transistor $T_2$. The collector of the transistor $T_2$ is connected through load inductor L which may be the vertical deflection winding of a cathode ray deflection yoke, to the negative terminal of the battery B. The emitter of the transistor $T_2$ is connected to the positive terminal of the battery B. A feedback capacitor $C_f$ connects the junction of the inductor L and the collector of the transistor $T_2$ with the junction of the resistors $R_1$ and $R_2$.

In the operation of the circuit of FIG. 1, the sweep capacitor $C_s$ charges through the sweep resistors $R_s$ towards the voltage of the battery B. The voltage across the sweep capacitor $C_s$ during the charging portion of a cycle, is less than the voltage across the resistor $R_1$, and the diode switch D is open (does not conduct). The increasing voltage across the sweep capacitor $C_s$ is applied between the base and emitter electrodes of the driver transistor $T_1$, providing an increasing base current in the transistor $T_1$, which is amplified in $T_1$ to provide a correspondingly increasing collector current in $T_1$. This increasing collector current in $T_1$, applied to the base of the output transistor $T_2$, causes its collector current, and the current through the load inductor L to increase. During this sweep portion of a cycle, the circuit operates substantially as a direct current amplifier of the voltage developed across capacitor $C_s$.

When the voltage across capacitor $C_s$ reaches that level set by the voltage divider $R_1$–$R_2$, the diode switch D closes (conducts), and connects a positive feedback path from the load inductor L, through the feedback capacitor $C_f$ to the base of the driver transistor $T_1$, starting an oscillation involving the energy in, and the inductance of inductor L, and the capacitances of the capacitors $C_s$ and $C_f$ in a tuned oscillatory circuit. Initially, the current flows is through the diode D in a forward direction, and in capacitor $C_s$ in the direction opposite to that which initially charged the capacitor $C_s$. The latter discharges very quickly (or more accurately, charges negatively as shown by the voltage graph above $C_s$ in FIG. 1) until one or both of the transistors cut off. When the oscillatory current attempts to reverse its polarity at the end of this part of the cycle, the diode D again opens, and the circuit again operates as a direct current amplifier. Any excess voltage in the capacitor $C_f$ leaks off through the resistors $R_1$ and $R_2$. The sweep capacitor $C_s$ again charges through the sweep resistor $R_s$ to repeat the sweep portion of the cycle. When the load inductor L is a deflection yoke of a cathode ray tube, the building up of energy in it corresponds to the sweep portion of a cycle, and the discharge of the sweep capacitor by means of this energy corresponds to the retrace portion of the cathode ray deflection.

Figure 2:
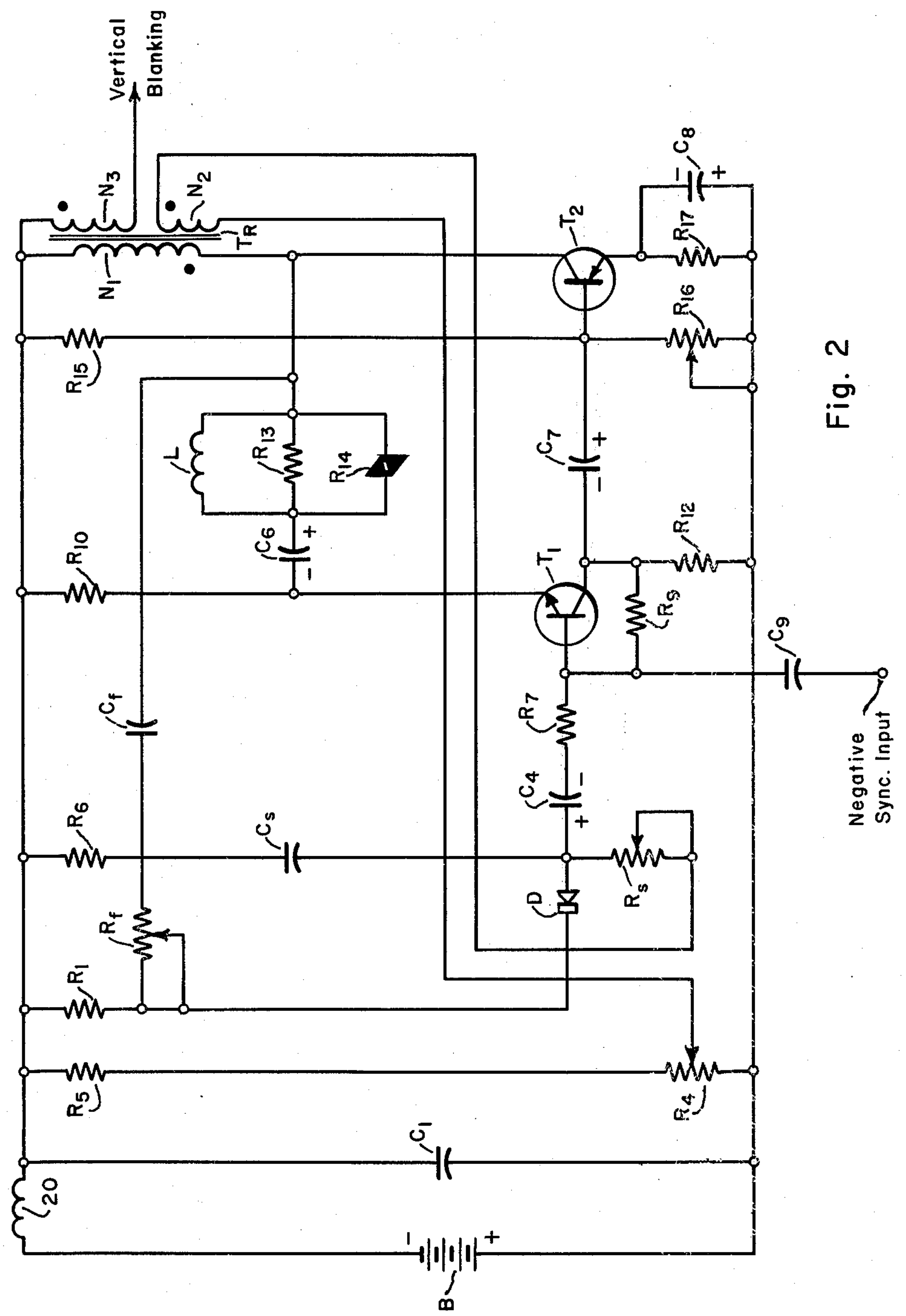
FIG. 2 is a schematic diagram of a vertical deflection circuit of a television receiver embodying this invention.

Referring now to FIG. 2 where components common to both FIGS. 1 and 2 are given the same reference characters, a filter choke 20 and a filter capacitor $C_1$ are connected in series across the voltage source battery B, and serve as an LC filter to keep noise from other sections of a television receiver out of the vertical deflection circuit of FIG. 2. Voltage divider resistors $R_4$ and $R_5$ are connected in series across the battery B. The resistor $R_4$ in this embodiment of the invention, is a potentiometer so that it can act as a linearity control. Sweep capacitor $C_s$ is connected in series with resistor $R_6$, sweep resistor $R_s$, and positive feedback winding $N_2$ of output transformer $T_r$, to the adjustable brush of resistor $R_4$. The variable resistor $R_s$ controls the charging time constant and hence the frequency of oscillation, and the resistor potentiometer $R_4$ controls linearity.

The adjustable resistor $R_s$ controls the RC constant of the charging network comprising $C_s$, $R_s$, $R_6$ and $R_4$. Thus, adjustment of resistor $R_s$ controls the charging time constant and hence the frequency of the system. Resistor $R_4$ serves as a linearity control by enabling adjustment of the relative amplitudes of sawtooth ramp and parabolic component developed across capacitor $C_s$ during the charging interval. The parabolic component is generated by integration, in capacitor $C_s$, of the feedback signal from winding $N_2$. The feedback winding $N_2$ is connected serially between the adjustable tap or brush of resistor $R_s$ and the brush of resistor $R_4$.

Resistor $R_6$ is connected serially with capacitor $C_s$, diode switch D and feedback capacitor $C_f$ in the discharge loop across winding $N_1$. Thus resistor $R_6$ serves to limit the loading effect of $C_s$ and $C_f$ on the collector circuit of $T_2$ at high frequencies thereby providing increased gain at high frequencies to improve the regenerative action and ease of synchronization. The voltage divider formed by resistors $R_4$ and $R_5$ provides an adjustable reference voltage level at the brush of resistor $R_4$, toward which level capacitor $C_s$ charges. Adjustment of $R_4$ determines the amount of D.C. voltage applied across $R_s$ and $C_s$ relative to the amount of positive feedback voltage from winding $N_2$.

The junction of sweep resistor $R_s$ and capacitor $C_s$ is connected to the anode of diode switch D, and also through coupling capacitor $C_4$ and resistor $R_7$ to the base of the NPN driver transistor $T_1$. The base of the driver transistor is also connected through resistor $R_9$ to its collector which is connected through resistor $R_{12}$ to the positive side of the voltage source B. Resistors $R_9$ and $R_{12}$ provide bias for $T_1$ to ensure against deleterious effects of thermal variations and slight differences in the characteristics of different transistors of the same type. The emitter of the transistor $T_1$ is connected through resistor $R_{10}$ and through choke 20 to the negative side of the voltage source B, and through blocking capacitor $C_6$ to one end terminal of vertical deflection yoke L. The other end terminal of the yoke L is connected to one end of primary winding $N_1$ of the transformer $T_r$, the other end of which is connected through choke 20 to the negative side of the battery B. A damping resistor $R_{13}$, and a clamping varistor $R_{14}$ are shunted across the yoke L. Varistor $R_{14}$ is a nonlinear resistance device which becomes more conductive at higher voltages thereby operating as a damper to prevent the application of high voltage pulses from yoke L to the collector of transistor $T_2$. The use of varistor $R_{14}$ enables transistors of lower voltage ratings to be used in the output stage.

The collector of the driver transistor $T_1$ is also connected through coupling capacitor $C_7$ to the base of PNP output transistor $T_2$, the collector of which is connected to one end terminal of the transformer winding $N_1$, and to yoke L. Alternatively winding $N_1$ may be provided with an intermediate tap or terminal with the collector electrode of transistor $T_2$ being connected thereto and yoke L being connected to the end terminal if impedance matching is desired between the collector circuit and the yoke. Likewise, it is to be understood that transformer $T_r$ may be provided with separate windings for connection respectively, to the yoke L and to the output stage collector circuit. In that case, the blocking capacitor $C_6$ could be eliminated and the additional transformer winding would be connected directly across the yoke L thereby isolating the yoke from the D.C. current paths of the system. The emitter of the output transistor $T_2$ is connected through bias resistor $R_{17}$, which is shunted by bypass capacitor $C_8$, to the positive side of the battery B. The base of the output transistor $T_2$ is also connected through bias divider resistor $R_{15}$ and through choke 20 to the negative side of the battery B. The base electrode is further connected through adjustable bias divider resistor $R_{16}$ to the positive side of the battery. Winding $N_3$ of the transformer $T_r$ is connected at one end to the negative side of the battery B, and is connected at its other end to a conventional vertical blanking circuit (not shown) for applying cutoff bias to the cathode ray tube during the retrace interval.

The yoke L is connected through feedback capacitor $C_f$ and feedback resistor $R_f$ to the cathode of the diode D, which also is connected through resistor $R_1$ and choke 20 to the negative side of the battery B.

The circuit as illustrated in FIG. 2 is particularly adapted for use as the vertical deflection wave generator of an otherwise conventional television receiver. In such receivers the video detector is normally arranged to produce a composite video signal of negative polarity with respect to ground or a point of reference potential, and with the synchronizing components of the signal extending in a negative sense. Such conventional negative going synchronizing signals may be applied from the television receiver synchronizing signal separator circuit (not shown) through coupling capacitor $C_9$ to the base electrode of the driver transistor $T_1$. It is to be understood that the oscillatory circuit of the present invention also may be synchronized by positive going synchronizing pulses applied either to the base of the output transistor $T_2$ or to the base of the input transistor if a PNP input stage is used.

The black dots at the ends of the windings of the transformer $T_r$ indicate ends having the same polarity.

Since A.C. coupling to the yoke L is desired, D.C. isolation is provided by the blocking capacitor $C_6$ which couples the series combination of resistor $R_{10}$ and the yoke L in shunt with winding $N_1$ for A.C. signals. Winding $N_1$ provides a current path from the collector of transistor $T_2$ to the battery B for the D.C. component of collector current.

The resistor $R_{10}$ samples the yoke current and develops a negative feedback voltage which is applied to the emitter of the driver transistor $T_1$. This negative feedback corrects for waveform non-linearities which may result from non-linear transistor, yoke and choke characteristics and the inductive nature of the coupling winding $N_1$. This negative feedback feature of the apparatus of FIG. 2 is more fully described and claimed in U.S. Patent No. 3,111,602, and assigned to the same assignee as the present application.

The negative feedback does not reduce the non-linearity inherent in the charging circuit. For this reason, and to further reduce the overall distortion, some shaping of the waveform applied to the base of the driver transistor $T_1$ is provided by using positive feedback during sweep periods, applied through the winding $N_2$ which is coupled to the winding $N_1$. The output sawtooth applied through the feedback winding $N_2$ by induction from winding $N_1$ is integrated by the sweep resistance and capacitance $C_s$ to provide a parabolic component of voltage across the sweep capacitor.

In the operation of FIG. 2, the sweep capacitor $C_s$ is charged during the charging portion of the cycle by current flow from the positive terminal of battery B through a portion of resistor $R_4$, through winding $N_2$, resistor $R_s$, capacitor $C_s$ and resistor $R_6$ back to the negative terminal of the battery. More exactly, the charging circuit includes the network resistance through resistors $R_4$ and $R_5$ between the adjustable brush of resistor $R_4$ and the upper end of resistor $R_6$. Thus, resistor $R_5$ plus the upper portion of resistor $R_4$ is effectively in parallel with the lower portion of $R_4$. The voltage applied to the charging circuit for charging $C_s$ is, accordingly, a portion of the battery voltage as determined by the adjustment of $R_4$ plus a sawtooth component from winding $N_2$. The positive going voltage at the lower plate of sweep capacitor $C_s$ is applied to the base of the transistor $T_1$, providing an increasing collector current in the transistor $T_1$ which applied to the base of the output transistor $T_2$, causes its collector current, and hence the current in the yoke L to increase.

At the beginning of the charging interval the cathode of diode D is positive in relation to its anode because of the minimum charge condition of capacitor $C_s$. "Minimum charge condition" is to be understood as meaning the most negative potential of the lower terminal of capacitor $C_s$ relative to its upper terminal regardless of whether the capacitor is actually charged in one polarity or the other. As current flows to the lower plate of capacitor $C_s$ from resistor $R_s$, the anode of diode D goes in a positive direction relative to its cathode. When the charge condition of capacitor $C_s$ becomes such that diode switch D is forwardly biased the diode conducts and completes a regenerative feedback path which may be traced as follows: A pulse signal developed across the yoke L, the capacitor $C_6$ and resistor $R_{10}$ in series, is coupled through capacitor $C_f$ and resistor $R_f$ in series to the resistor $R_1$, and through the diode D which is conducting at this time, to capacitor $C_s$ and resistor $R_6$ in series. The resistor $R_s$, the linearity winding $N_2$ and the resistance seen at the brush of resistor $R_4$ are effectively in shunt with the $R_6$–$C_s$ combination, however, their effect is small and of no essential importance during the regenerative portion of the cycle.

Resistance $R_f$ is adjustable to control the effectiveness of the regenerative portion of the cycle in discharging the sweep capacitor $C_s$. Therefore, it serves as a sawtooth amplitude control. From the capacitor $C_s$ the feedback signal is coupled through the capacitor $C_4$ and the resistor $R_7$ to the base of the driver transistor $T_1$. The signal is amplified in the latter and applied through the coupling capacitor $C_7$ to the base of the output transistor $T_2$. The feedback signal after further amplification by the output transistor $T_2$ is developed across the yoke L, the capacitor $C_6$ and the resistor $R_{10}$ in series, in such a phase as to sustain oscillation in the usual regenerative manner. This action ceases when the polarity of the signal in the feedback path, and the current in the diode, attempt to reverse, opening the diode and hence the regenerative loop.

In application of the circuit of FIG. 2 for cathode ray deflection, retrace takes place during the above described regenerative portion of the cycle. Rapid retrace is enabled by using the reactive energy stored in winding $N_1$ and the yoke L to rapidly and significantly alter the charge on the charging capacitor $C_s$. The inverse voltage or "flyback" appearing across the yoke L when transistor $T_2$ is cutoff drives current through $C_6$ and $R_{10}$, in series and thence through capacitor $C_s$, diode D, resistor $R_f$ and capacitor $C_f$ back to the yoke winding. This current flow removes substantially all charge from $C_s$ and in certain embodiments within the scope of the invention may leave the lower plate of capacitor $C_s$ charged negative relative to the upper plate. The foregoing flow of current in the forward direction through diode D discharges the capacitor $C_s$ very quickly providing rapid reconditioning of the charging circuit for the next sweep interval. It is to be noted that no active elements such as tubes or transistors are included in the high current discharge path. When the oscillatory current through the discharge loop attempts to reverse its direction due to the tuned circuit comprising yoke L, and capacitors $C_6$, $C_s$ and $C_f$ the diode switch D becomes an open circuit and the system begins the substantially linear charging interval with capacitor $C_s$ being again charged by current flow through $R_s$ as heretofore described.

Figure 3:
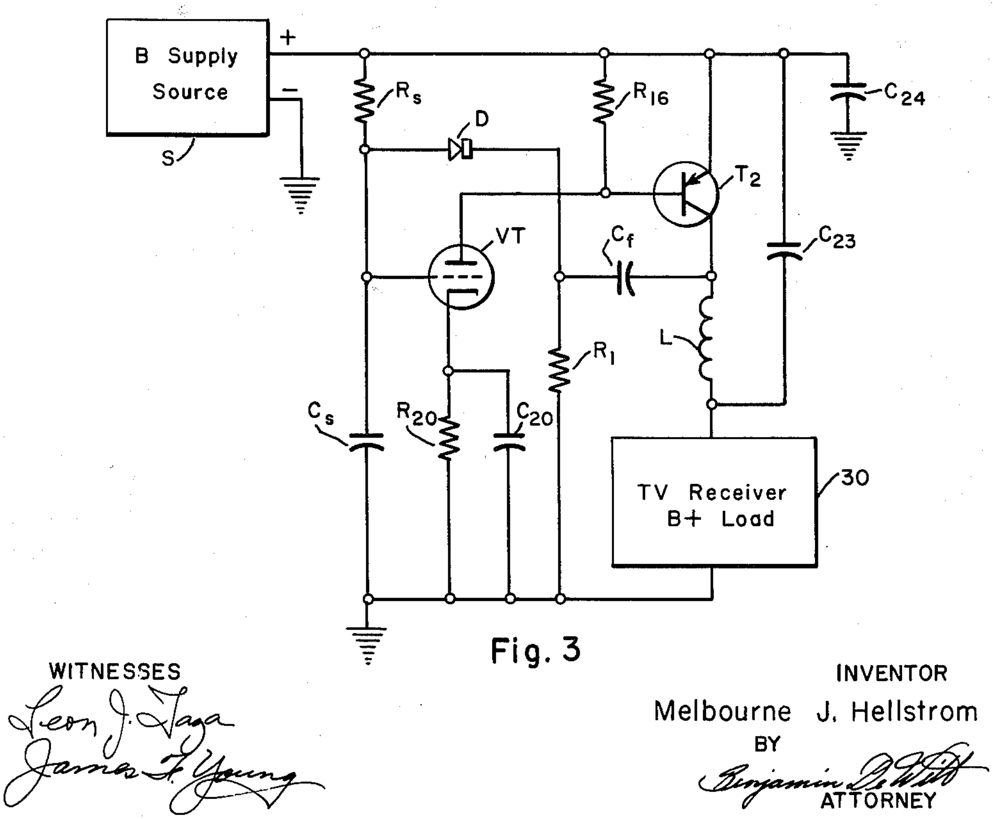
FIG. 3 is a circuit diagram of a pulse generating circuit embodying this invention, similar in some respects to FIG. 1 and differing particularly in that a vacuum tube is used for a driver instead of a transistor.

Referring now to FIG. 3 where components similar to those of FIGS. 1 and 2 are given the same reference characters, a conventional B voltage supply source S for a television receiver, has its positive terminal connected through sweep resistor $R_s$ to the anode of diode switch D, to the control grid of vacuum tube VT, and through sweep capacitor $C_s$ to a point of reference potential illustrated as ground, with the negative terminal of the source S also being grounded. The cathode of the tube VT is connected through bias resistor $R_{20}$ to ground, and is shunted by bypass capacitor $C_{20}$. The anode of the tube VT is connected to the base of output transistor $T_2$, and through resistor $R_{16}$ to the positive terminal of the source S. The resistor $R_{16}$ helps the collector of the transistor $T_2$ support a higher flyback pulse during retrace. The cathode of the diode D is connected through the resistor $R_1$ to ground, and through feedback capacitor $C_f$ to one end terminal of deflection yoke L, which yoke end terminal is also connected to the collector of the transistor $T_2$. The other end terminal of the yoke L is connected to B+ load 30 of the receiver, and is connected through bypass capacitor $C_{23}$ to the positive terminal of the source S. A conventional filter capacitor $C_{24}$ is connected to the positive terminal of the source S and to ground.

In the operation of the circuit of FIG. 3, the sweep capacitor $C_s$ is charged through the sweep resistor $R_s$ from the source S. As the charge in the capacitor $C_s$ increases the grid of the tube VT becomes more positive, causing a substantially linear increase in its anode current. Substantially all the anode current of the tube VT flows through the base to emitter circuit of the transistor $T_2$. This current is amplified by the transistor $T_2$, the collector current of which flows through the yoke L as the yoke sweep current.

Assuming a typical D.C. voltage of 220 volts at the source S, the D.C. voltage at the B+ load 30 would typically be about 195 volts, with the drop across capacitor $C_{23}$ being about 25 volts. The 195 volts across block 30 is sufficient to energize substantially all the conventional other circuits of the receiver, which circuits may be considered as being within the block 30.

When the diode D starts to conduct, the rate of change of voltage across the sweep capacitor $C_s$, the rate of change of the anode current of the tube VT, and the rate of change of the collector current of the output transistor $T_2$ suddenly reverse to a high negative value. The sudden change in the time derivative of the collector current of the transistor $T_2$ causes a negative increment of voltage at its collector. An oscillation involving the inductance of the yoke and the capacitances of the capacitors $C_f$ and $C_s$ starts. During substantially the first half wave of this oscillation, current flows through the diode D to quickly discharge the sweep capacitor $C_s$. When the oscillation current starts to reverse at the end of approximately its first half cycle, the diode switch again opens, and the circuit again operates substantially as a direct current amplifier of the voltage developed across sweep capacitor $C_s$.

In FIG. 3, the falling current gain characteristic of the transistor $T_2$ is compensated for by the rising grid-anode transconductance of the tube VT, providing more linear amplification, and more flexibility in obtaining the desired output wave shape when utilizing transistors having inherent distortion characteristics.

Using a driver stage ahead of the output transistor enables a smaller sweep capacitor to be used than in circuits in which the charging capacitor drives the deflection output stage directly. In the latter type circuits, the driver device (tube or transistor) is used to discharge a large sweep capacitor, and hence the driver device in such circuits must have an appreciably greater power rating than in the various embodiments of the present invention.

It is to be understood that in all the foregoing embodiments, other forms of an electronic switch such as a transistor could, of course, be used instead of the diode switch D. Likewise, while a NPN driver and a PNP output transistor have been used in the circuits of FIGS. 1 and 2, and a vacuum tube driver and a PNP output transistor have been used in the circuit of FIG. 3, other combinations of transistors only, tubes only, or tubes and transistors together, or a single tube or transistor could be used without departure from the spirit of the invention.

While the invention has been described with particular embodiments and examples, it will be understood of course, that modifications, substitutions and the like may be made without departing from its scope.

What is claimed, is:

A sweep circuit for a deflection yoke of a television receiver, comprising a sweep capacitor; means including a voltage source for changing the charge of said capacitor from a first level to a second level; a voltage divider including a linearity control potentiometer having a brush, connected to said source; a sweep frequency control potentiometer having one end connected to said capacitor; a linearity coil connected serially between the brush of the linearity control potentiometer and the brush of the frequency control potentiometer; means including said potentiometers and coil connecting said capacitor across said source; a driver transistor having its input circuit coupled to the junction of said frequency control potentiometer and said capacitor; an output transistor having its input circuit coupled to the output circuit of said driver transistor, a blocking capacitor and a choke coil connected in series across said yoke, the combination of said blocking capacitor, said choke and said yoke being connected to the output circuit of said output transistor; said choke and linearity coils being inductively coupled, a diode; means coupling said diode serially with said sweep capacitor; a feedback capacitor; and means including said yoke, said feedback and sweep capacitors and said diode forming a regenerative feedback circuit for utilizing energy stored in said yoke during said sweep to thereafter change the charge of said capacitor from said second level to said first level by means of reactive current flow from said yoke to said sweep capacitor through said diode and said feedback capacitor.

References Cited by the Examiner

UNITED STATES PATENTS

| | | | |
|---|---|---|---|
| 2,729,766 | 1/56 | Vilkomerson | 315—27 |
| 2,788,449 | 4/57 | Bright | 331—113 |
| 2,896,115 | 7/59 | Guggi | 315—27 |
| 2,911,566 | 11/59 | Taylor | 315—27 |
| 2,913,625 | 11/59 | Finkelstein | 315—27 |
| 2,939,040 | 5/60 | Isabeau | 315—27 |
| 2,954,504 | 9/60 | Saudinaitis | 315—27 |
| 2,958,003 | 10/60 | Marshall | 315—27 |

DAVID G. REDINBAUGH, *Primary Examiner.*

RALPH G. NILSON, GEORGE WESTBY, ARTHUR GAUSS, *Examiners.*